(12) United States Patent
Wang

(10) Patent No.: US 8,860,298 B2
(45) Date of Patent: Oct. 14, 2014

(54) DISPLAY AND MANUFACTURING METHOD THEREOF

(71) Applicant: Innolux Corporation, Miao-Li County (TW)

(72) Inventor: Shih-Chang Wang, Miao-Li County (TW)

(73) Assignee: Innolux Corporation, Miao-Li County (TW)

( * ) Notice: Subject to any disclaimer, the term of this patent is extended or adjusted under 35 U.S.C. 154(b) by 0 days.

(21) Appl. No.: 13/761,205

(22) Filed: Feb. 7, 2013

(65) Prior Publication Data
US 2013/0241402 A1    Sep. 19, 2013

(30) Foreign Application Priority Data

Mar. 19, 2012    (TW) .............................. 101109376 A

(51) Int. Cl.
*H01J 1/62* (2006.01)
*H01J 63/04* (2006.01)
*H01L 51/52* (2006.01)
*H05B 33/10* (2006.01)
*H05B 33/04* (2006.01)

(52) U.S. Cl.
CPC ............ *H05B 33/04* (2013.01); *H01L 51/5246* (2013.01); *H01L 51/5237* (2013.01); *H01L 51/5253* (2013.01); *H01L 2251/55* (2013.01); *H05B 33/10* (2013.01)
USPC ......................................... 313/504; 313/512

(58) Field of Classification Search
CPC .... H05B 33/04; H05B 33/10; H01L 51/5246; H01L 51/5237; H01L 2251/55; H01L 51/5253
USPC ............ 313/504, 512; 257/99; 428/35.7, 690; 445/24, 25
See application file for complete search history.

(56) References Cited

U.S. PATENT DOCUMENTS

| | | | |
|---|---|---|---|
| 6,413,645 | B1 | 7/2002 | Graff et al. |
| 6,998,776 | B2 | 2/2006 | Aitken et al. |
| 7,109,649 | B2 * | 9/2006 | Kato et al. ..................... 313/504 |
| 7,407,423 | B2 | 8/2008 | Aitken et al. |
| 7,564,185 | B2 | 7/2009 | Song et al. |
| 7,736,936 | B2 | 6/2010 | Tanaka |
| 7,990,059 | B2 * | 8/2011 | Matsudate et al. ............ 313/512 |
| 8,003,999 | B2 | 8/2011 | Cho et al. |

(Continued)

FOREIGN PATENT DOCUMENTS

| | | |
|---|---|---|
| CN | 101136359 A | 3/2008 |
| TW | 200915249 A | 4/2009 |

OTHER PUBLICATIONS

TW Office Action dated Aug. 21, 2014.
English Abstract of TW200915249 (Published Apr. 1, 2009).

*Primary Examiner* — Nimeshkumar Patel
*Assistant Examiner* — Glenn Zimmerman
(74) *Attorney, Agent, or Firm* — McClure, Qualey & Rodack, LLP

(57) ABSTRACT

A display and a manufacturing method thereof are provided. The display includes a frame, an organic light-emitting diode (OLED) panel, a transparent element and a glue. The OLED panel is disposed in the frame. The transparent element is disposed on the OLED panel. The glue is filled between the OLED panel and the transparent element and between the OLED panel and the frame.

10 Claims, 5 Drawing Sheets

(56) References Cited

U.S. PATENT DOCUMENTS

| | | | |
|---|---|---|---|
| 2005/0116637 A1* | 6/2005 | Yoshizawa | 313/512 |
| 2006/0066234 A1* | 3/2006 | Lu et al. | 313/512 |
| 2007/0040492 A1* | 2/2007 | Nakamura | 313/504 |
| 2009/0207560 A1* | 8/2009 | Lee | 361/679.01 |
| 2010/0012966 A1 | 1/2010 | Choi et al. | |
| 2010/0045177 A1 | 2/2010 | Oh et al. | |
| 2010/0075082 A1* | 3/2010 | Komada et al. | 428/35.7 |
| 2010/0118245 A1* | 5/2010 | Toyoda et al. | 349/122 |
| 2011/0227126 A1* | 9/2011 | Yamazaki et al. | 257/99 |
| 2011/0242467 A1* | 10/2011 | Kim et al. | 349/113 |
| 2012/0313508 A1* | 12/2012 | Son et al. | 313/504 |
| 2013/0200340 A1* | 8/2013 | Otsu et al. | 257/40 |

\* cited by examiner

DISPLAY AND MANUFACTURING METHOD THEREOF

This application claims the benefit of Taiwan application Serial No. 101109376, filed Mar. 19, 2012, the subject matter of which is incorporated herein by reference.

BACKGROUND OF THE INVENTION

1. Field of the Invention

The invention relates in general to a display and a manufacturing method thereof, and more particularly to an organic light-emitting diode (OLED) display and a manufacturing method thereof.

2. Description of the Related Art

Along with the development and advance in the display technology, various displays are constantly provided. The organic light-emitting diode (OLED), having the features of self-luminosity, small volume and high color saturation, has been recognized as the star of the future in the display technology.

In the course of the development in the OLED, the research personnel found that the OLED may easily be damaged by moisture or oxygen and the lifespan of the OLED is largely reduced. The research personnel use various designs to increase the water resistance and oxygen barrier performance of the OLED but at the same time the process speed of the OLED is slowed down. Therefore, the development of technology of the OLED encounters a bottleneck.

SUMMARY OF THE INVENTION

The disclosure is directed to a display and a manufacturing method thereof. The design of filling the glue between the organic light-emitting diode (OLED) panel and the frame makes the display have the advantages of high water resistance, high oxygen barrier performance, and fast process speed.

According to an embodiment of the present disclosure, a display is provided. The display includes a frame, an OLED panel, a transparent element and a glue. The OLED panel is disposed in the frame. The transparent element is disposed on the OLED panel. The glue is filled between the OLED panel and the transparent element, and filled between the OLED panel and the frame.

According to another embodiment of the present disclosure, a manufacturing method of a display is provided. The manufacturing method includes the following steps. An OLED panel is provided. A glue is coated on the OLED panel. The OLED panel is disposed in the frame. The transparent element is disposed on the glue. The transparent element and the OLED panel are compressed, such that the glue is filled between the OLED panel and the transparent element and between the OLED panel and the frame.

The above and other aspects of the invention will become better understood with regard to the following detailed description of the preferred but non-limiting embodiment(s). The following description is made with reference to the accompanying drawings.

DETAILED DESCRIPTION OF THE INVENTION

A number of embodiments are disclosed below for elaborating the disclosure. The design of filling a glue between an organic light-emitting diode (OLED) panel and a frame makes a display have the advantages of high water resistance, high oxygen barrier performance, and fast process speed. However, the embodiments of the invention are for detailed descriptions only, not for limiting the scope of protection of the invention. Furthermore, secondary or unimportant elements are omitted in the accompanying diagrams of the embodiments for highlighting the technical features of the invention.

Figure 1:
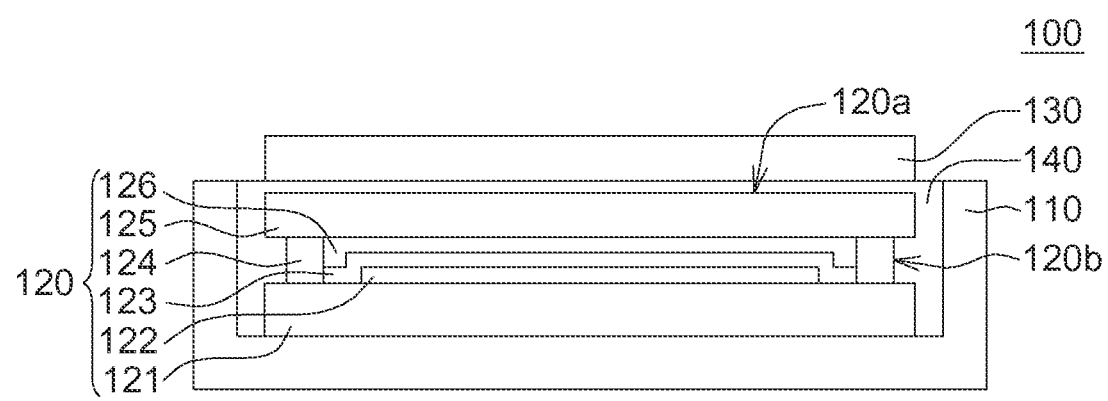
FIG. 1 illustrates a schematic diagram of a display.

Referring to FIG. 1, a schematic diagram of a display 100 is illustrated. The display 100 includes a frame 110, an OLED panel 120, a transparent element 130 and a glue 140. The frame 110, such as an iron frame, is used for carrying and protecting the internal elements of the display 100. The OLED panel 120 can be active or passive. The OLED panel 120 is disposed in the frame 110. The transparent element 130 can be a panel or an optical film, wherein the panel is such as a touch panel or a 2D/3D switch panel, and the optical film can be a polarizer, a phase delayer, a barrier or a lenticular lens. The transparent element 130 is disposed on the OLED panel 120, wherein the transparent element 130 and the OLED panel 120 can be disposed in the frame 110 at the same. The transparent element 130 can be partly or entirely exposed outside the frame 110. The glue 140 is filled between the OLED panel 120 and the transparent element 130 for binding the OLED panel 120 and the transparent element 130. Besides, the glue 140 is filled between the OLED panel 120 and the frame 110.

The OLED panel 120 may be easily damaged by moisture or oxygen and its lifespan is thus shortened. The glue 140 of the present embodiment is filled not only between the OLED panel 120 and the transparent element 130 for binding the transparent element 130 and the OLED panel 120 but also between the OLED panel 120 and the frame 110, such that both the top surface 120a and the side surface 120b of the OLED panel 120 are well protected.

The glue 140 is filled between the OLED panel 120 and the frame 110. On one hand, the glue 140 binds the OLED panel 120 and the frame 110, such that when the display 100 wobbles, the OLED panel 120 can be firmly disposed in the frame 110, and be prevented from any damage caused by moving in and colliding with the frame 110. On the other hand, the glue 140 covers the side packaging region of the OLED panel 120. The glue 140 covers the side packaging region of the OLED panel 120 effectively blocks the moisture and oxygen in the air which will invade the OLED panel 120 via the side packaging region of the OLED panel 120 and shorten the lifespan of the OLED panel 120.

In the present embodiment, to well protect the side surface 120b of the OLED panel 120, the fill rate of the glue 140 filled between the OLED panel 120 and the frame 110 is at least greater than 50%, such as greater than 70% or 90%. The fill rate can be determined according to the material of the glue 140 and the process speed.

Figure 2:
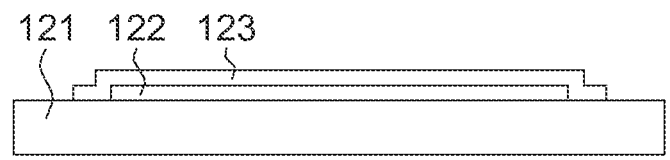
FIGS. 2 to 9 illustrate a flowchart of a manufacturing method of the display.

Referring to FIGS. 2 to 9, a flowchart of a manufacturing method of the display 100 is illustrated. Firstly, in FIGS. 2 to 5, the OLED panel 120 (illustrated in FIG. 5) is provided. In the step of providing the OLED panel 120, as indicated in FIG. 2, a thin film transistor (TFT) substrate 121 is provided. The TFT substrate 121 is used for providing a driving circuit.

Next, in FIG. 2, a plurality of OLEDs 122 are disposed on the TFT substrate 121. The OLEDs 122 can emit white lights or color lights (such as red, green, and blue lights). In the present embodiment, the OLEDs 122 emits white lights. The OLEDs 122 can be arranged in arrays to form a plurality of pixels arranged in matrixes.

Then, in FIG. 2, the OLEDs 122 are covered with a protection layer 123 to prevent the OLEDs 122 being damaged in subsequent manufacturing process.

Figure 3:
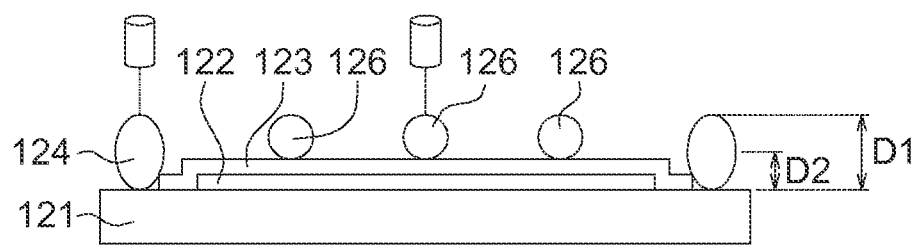

Next, in FIG. 3, a sealant 124 is disposed at a periphery of the TFT substrate 121. The height D1 of the sealant 124 is greater than the aggregate thickness D2 of the OLEDs 122 and the protection layer 123.

Then, in FIG. 3, under a vacuum environment, a filler material 126 is disposed on the TFT substrate 121 by one drop filling (ODF) process. In general, the OLEDs 122 can be uneven, and the protection layer 123 disposed thereon can also be uneven. The one drop filling process assures that the filler material 126 is spread over the uneven protection layer 123.

Figure 4:
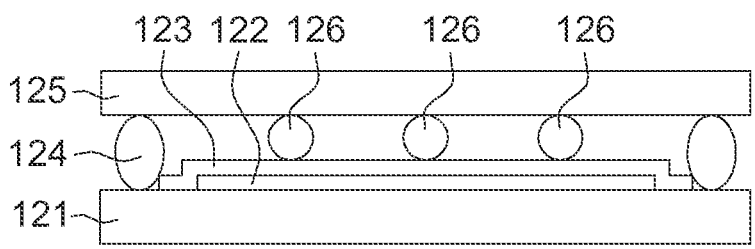

Next, in FIG. 4, under a vacuum environment, a color filter substrate 125 is disposed on the sealant 124. In other embodiments, when the OLEDs 122 emit color lights, a transparent protection substrate (not illustrated) instead of the color filter substrate 125 is disposed on the sealant 124.

Figure 5:
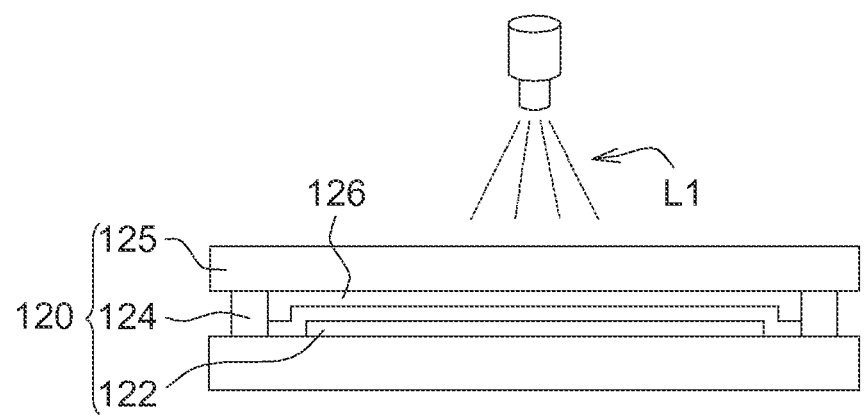

Then, in FIG. 5, under a vacuum environment, as the color filter substrate 125 and the sealant 124 are bound, the filler material 126 diffuses on the protection layer 123 until the filler material 126 is completely filled among the color filter substrate 125, the sealant 124 and the TFT substrate 121, and no moisture or oxygen is left among the color filter substrate 125, the sealant 124 and the TFT substrate 121.

Next, in FIG. 5, the filler material 126 and the sealant 124 are cured by an ultra-violet light L1 (or a heat source). Thus, the manufacturing of the OLED panel 120 is completed. Meanwhile, the OLEDs 122 are well protected by the protection layer 123 and the filler material 126.

In one embodiment, the color filter substrate 125 and the TFT substrate 121 can be bound by the sealant 124 but not used the filler material 126 by the one drop filling process (ODF) process.

In one embodiment, the OLEDs 122 can be directly bound by an optically clear adhesive (OCA) film (not illustrated) but not used the filler material 126 by the one drop filling process (ODF) process.

In the embodiment that only the sealant 124 is used for binding, a gap will existing between the color filter substrate 125 and the TFT substrate 121, and moisture or oxygen in the air can easily infiltrate the OLED panel 120 via the gap. Moreover, to assure the water resistance and oxygen barrier performance of the sealant 124, additional laser light (not illustrated) can be used for curing the sealant strips one by one, hence increasing the manufacturing cost and slowing down the process speed.

In the embodiment that the optically clear adhesive film (OCA film) is used, small gaps still exists between the uneven OLEDs 122, then moisture or oxygen can easily infiltrate the small gaps.

In comparison, in the embodiment that the filler material 126 is used by one drop filling process (ODF) process, the moisture or oxygen can be prevented from being left among the color filter substrate 125, the sealant 124 and the TFT substrate 121, such that the lifespan and optical performance of the OLEDs 122 are assured. Furthermore, in the embodiment that the filler material 126 is used by one drop filling process (ODF) process, the filler material can be entirely cured by using an ultra-violet light L1 (or heat source), not only the manufacturing cost can be reduced but also the process speed can be increased.

Figure 6:
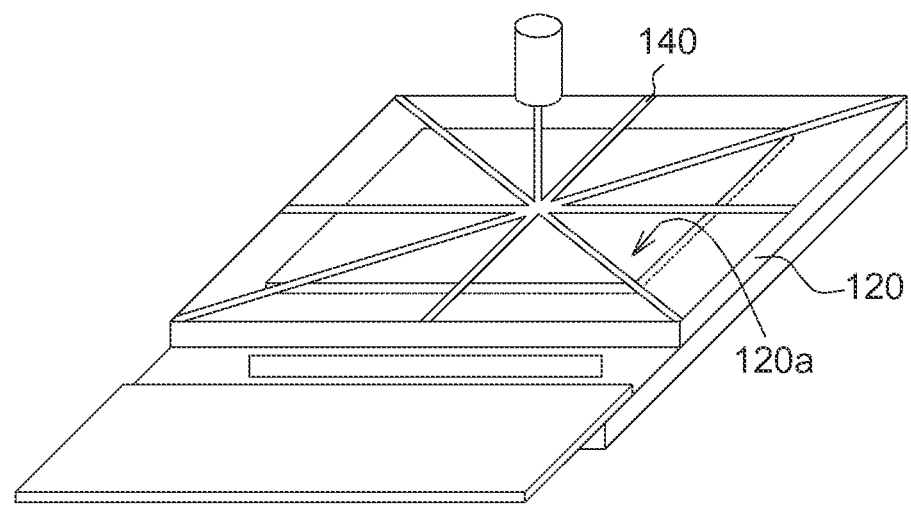
Figure 7:
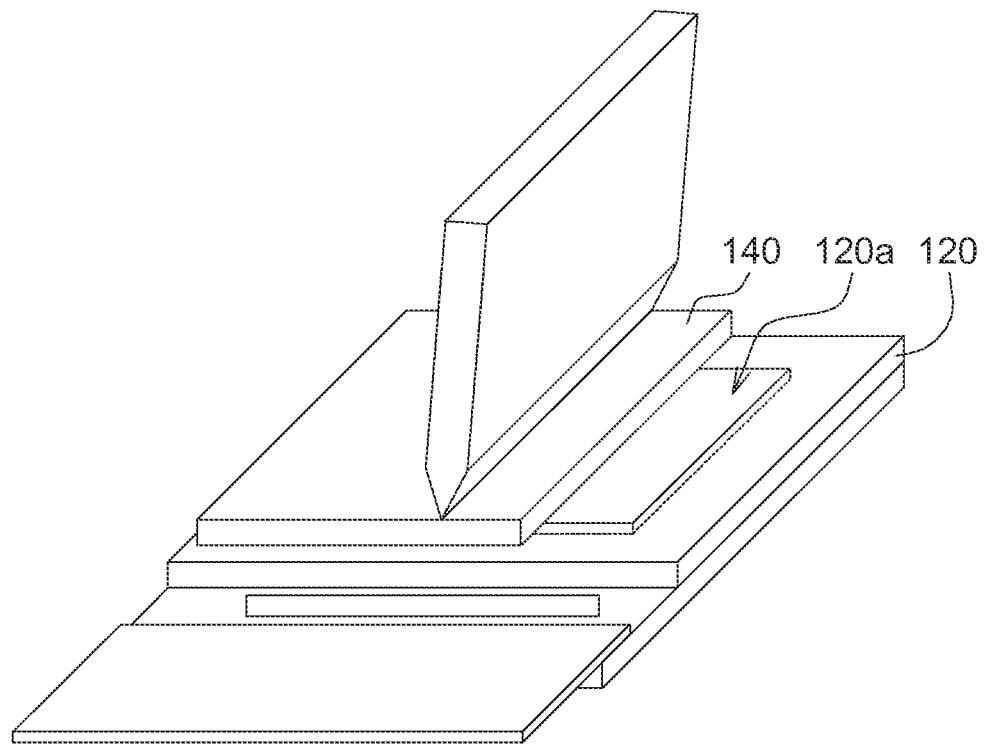

Following the steps of providing the OLED panel 120, the method proceeds to the steps in FIGS. 6 and 7.

In FIGS. 6 and 7, the glue 140 is coated on the OLED panel 120. The glue 140 can be an optical clear resin (OCR). In FIG. 6, the glue 140 can be uniformly coated on some regions and then be brushed over the OLED panel 120. In FIG. 7, the glue 140 is directly coated on an entire layer.

In the present step, since the top surface 120a of the OLED panel 120 is very even, the glue 140 can be seamlessly coated on the OLED panel 120.

In the present step, the water vapor transmission rate (WVTR) of the glue 140 is less than 20 g/m$^2$-day to assure that the glue 140 has high water resistance; the oxygen transmission rate (OTR) of the glue 140 is less than $1\times10^{-3}$ cc/m$^2$-day to assure that the glue 140 has high oxygen barrier performance; the optical transmission rate of the glue 140 is greater than 90% to assure that the glue 140 has high transmittance.

Figure 8:
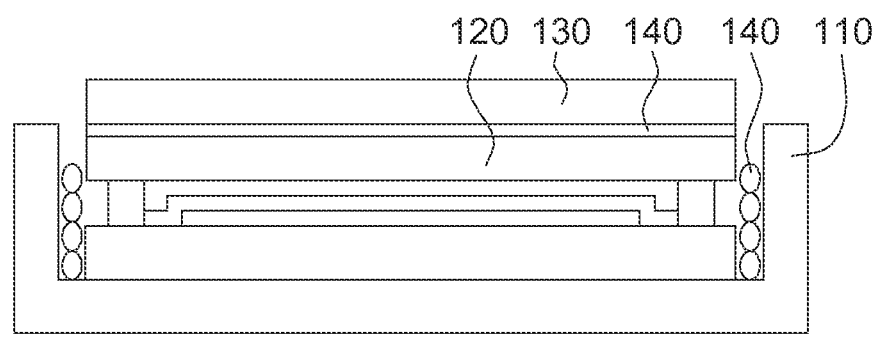

Then, in FIG. 8, the OLED panel 120 is disposed in the frame 110.

Next, in FIG. 8, the transparent element 130 is disposed on the glue 140.

Then, in FIG. 8, the transparent element 130 and the OLED panel 120 are compressed, such that the glue 140 is filled between the OLED panel 120 and the transparent element 130, and the glue 140 overflows to be filled between the OLED panel 120 and the frame 110 by capillarity effect.

In the compressing step, the glue 140 can infiltrate the gap between the OLED panel 120 and the frame 110 under a decompression exhaust environment (such as 50 to 1 Pa).

Figure 9:
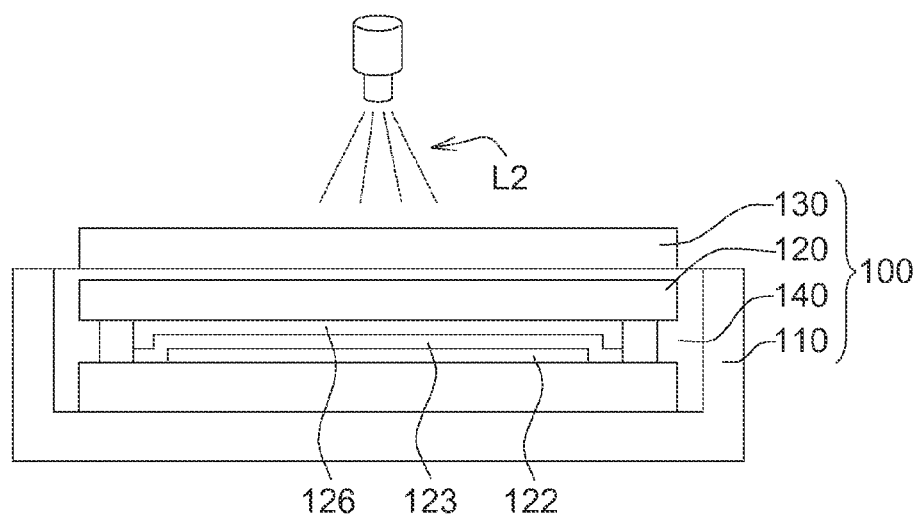

Next, in FIG. 9, the glue 140 is cured with an ultra-violet light L2 (or a heat source). Thus, the manufacturing of the display 100 is completed.

As disclosed above, the OLEDs 122 are protected by at least four layers, including the protection layer 123, the filler material 126, the glue 140, and the frame 110, such that the OLEDs 122 effectively prevented from the damage caused by moisture and oxygen.

While the invention has been described by way of example and in terms of the preferred embodiment (s), it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A display, comprising:
 a frame;
 an organic light-emitting diode (OLED) panel disposed in the frame;
 a transparent element disposed on the OLED panel; and
 a glue filled between the OLED panel and the transparent element and between the OLED panel and the frame, wherein a projection of the transparent element is surrounded by the frame and the top of the glue is not higher than that of a sidewall of the frame.

2. The display according to claim 1, wherein the water vapor transmission rate (WVTR) of the glue is less than 20 g/m$^2$-day.

3. The display according to claim 1, wherein the oxygen transmission rate (OTR) of the glue is less than $1\times10^{-3}$ cc/m$^2$-day.

4. The display according to claim 1, wherein the optical transmission rate of the glue is greater than 90%.

5. The display according to claim 1, wherein the transparent element is a panel.

6. The display according to claim 1, wherein the transparent element is an optical film.

7. The display according to claim 1, wherein the fill rate of the glue filled between the OLED panel and the frame is greater than 90%.

8. The display according to claim 1, wherein the glue is an ultra-violet light curing material or a thermal curing material.

9. The display according to claim 1, wherein the OLED panel comprises:
- a thin film transistor (TFT) substrate;
- a plurality of OLEDs disposed on the TFT substrate, wherein the OLEDs emit white lights;
- a protection layer covering the OLEDs;
- a sealant disposed at a periphery of the TFT substrate;
- a color filter substrate disposed on the sealant; and
- a filler material disposed among the color filter substrate, the sealant and the TFT substrate.

10. The display according to claim 1, wherein the OLED panel comprises:
- a TFT substrate;
- a plurality of OLEDs disposed on the TFT substrate, wherein the OLEDs emit color lights;
- a protection layer covering the OLEDs;
- a sealant disposed at a periphery of the TFT substrate;
- a protection substrate disposed on the sealant; and
- a filler material disposed among the protection substrate, the sealant and the TFT substrate.

* * * * *